United States Patent [19]

Custode

[11] Patent Number: 4,697,328
[45] Date of Patent: Oct. 6, 1987

[54] METHOD OF MAKING HARDENED NMOS SUB-MICRON FIELD EFFECT TRANSISTORS

[75] Inventor: Frank Z. Custode, Norco, Calif.
[73] Assignee: Rockwell International Corporation, El Segundo, Calif.
[21] Appl. No.: 856,302
[22] Filed: Apr. 28, 1986
[51] Int. Cl.[4] .................. H01L 21/385; H01L 21/425
[52] U.S. Cl. ...................................... 437/41; 437/235
[58] Field of Search .......................... 29/571, 578, 591; 148/187, 188

[56] References Cited

U.S. PATENT DOCUMENTS

| | | | |
|---|---|---|---|
| 4,210,993 | 7/1980 | Sunami | 29/571 |
| 4,231,051 | 10/1980 | Custode et al. | 29/589 X |
| 4,419,808 | 12/1983 | Tam et al. | 148/187 X |
| 4,444,605 | 4/1984 | Salwinski | 29/571 X |
| 4,477,962 | 10/1984 | Godejahn, Jr. | 29/591 X |
| 4,505,024 | 3/1985 | Kawate et al. | 29/591 X |
| 4,506,437 | 3/1985 | Godejahn, Jr. | 29/591 X |
| 4,519,126 | 5/1985 | Hsu | 29/571 |
| 4,616,401 | 10/1986 | Takeuchi | 29/591 X |
| 4,622,735 | 11/1986 | Shibata | 29/591 X |

*Primary Examiner*—George T. Ozaki
*Attorney, Agent, or Firm*—H. Fredrick Hamann; George A. Montanye; Wilfred G. Caldwell

[57] ABSTRACT

The invention provides a novel high speed hardened NMOS structure and process for developing the structure. In a first embodiment, the <100> surface of the silicon wafer is preserved intact by building the field oxide above this surface so there is no transition from the <100> plane to the <111> plane. In a first embodiment, one of the gate electrode overlaps is avoided, thereby eliminating the sidewalk effect or parasitic device from causing leakage on that side of the channel. The preferred embodiment provides a device with no field oxide extending into the silicon wafer and with no overlap of the gate electrode over the field oxide. This is achieved by causing the gate metal interconnect to proceed linearly along the active region over either the source or drain before it leaves the active region, thereby avoiding the establishing of an extra field in the gate region. An alternative method for accomplishing the foregoing is to provide double metal layers and allow the gate metal interconnect to leave the active area directly from the gate electrode because the spacing is sufficient to render the metal interconnect field ineffective to cause parasitic problems; also, in this embodiment the metal interconnect can be run linearly along the active region and depart the same over the source or drain thereby even decreasing gate capacitance effects. A method for establishing tiny contacts is disclosed which permits manufacture of the NMOS devices to sub-micron dimensions.

6 Claims, 26 Drawing Figures

FIG. 24

METHOD OF MAKING HARDENED NMOS SUB-MICRON FIELD EFFECT TRANSISTORS

This application includes subject matter related to the subject matter of a co-filed application entitled METHOD OF MAKING HARDENED CMOS SUB-MICRON SELF-ALIGNED TRANSISTORS, Ser. No. 856,304 filed Apr. 28, 1986 by the same inventor.

FIELD OF THE INVENTION

This invention relates to the field of NMOS processing, and, more particularly to hardened self-aligned devices.

BACKGROUND OF THE INVENTION

In the past few years, substantial progress has been made in the development of radiation-hard technologies; however, most solutions are not compatible with VLSI objectives, such as packing density, speed performance or ease of implementation. The present invention resolves these problems for NMOS devices into sub-micron sizes.

DESCRIPTION OF THE PRIOR ART

Exposure to radiation tends to shift thresholds of these devices into depletion; furthermore, surrounding areas to the channel are also adversely affected because prior art gate electrodes overlap the field regions. In the prior art, these surrounding areas are characterized by a smooth transition from active to field areas as the thin oxide over channel regions converts to thick oxide over the field regions; hence, providing a vulnerable region to radiation effects in the form of "sidewalk" parasitic transistors. This phenomena is manifested by pronounced increase in leakage currents. Further, this problem is made more severe because the parasitic transistor area is normally formed on a $<111>$ plane as opposed to a $<100>$ plane where there is a propensity for charge build-up trapping. Since radiation induced $V_T$ (threshold voltage) shifts bear a $t_{ox}$ (oxide thickness) dependence, this sidewalk region is also affected, creating a parasitic device solely turned on by radiation exposures.

This invention makes use of principles described hereinafter and principles from the equation describing threshold voltage:

$$V_T = -(\epsilon_s - 2\phi_F)/2 + (Q_B - Q_{ss})t_{ox}/\epsilon_{ox} - (t_{ox}^2/\epsilon_{ox}) \int_0^1 \mu\rho(\mu)d\mu$$

$V_T$ = threshold voltage (main or side parasitic transistors)
$\epsilon_s$ = permittivity of silicon
$\phi_F$ = Fermi potential
$Q_B$ = bulk charge
$Q_{ss}$ = oxide charge and interface charge
$t_{ox}$ = thickness oxide
$\epsilon_{ox}$ = permittivity of oxide
$\mu$ = interface charge
$\rho$ = function of space charge
$d\mu$ = derivative of interface charge.

The terms used in this expression are described to great extent in the literature. However, of particular interest are two terms: Qss and $\rho(\mu)$. These two terms have a greater impact on changing the threshold voltage of the parasitic sidewalk transistor. In the prior art, a sidewalk transistor is formed in the transition region between active device area and the field area isolating two distinct active areas. This transition region has a crystallographic orientation of $<111>$ as opposed to $<100>$, rendering larger values of Qss (oxide charge and interface states). The $\rho(\mu)$ term within the integral can bring about significant shifts in threshold voltage, an increase in $\rho(\mu)$, which occurs under exposure to radiation harsh environments, will result in a negative shift establishing deleterious conduction paths, as shown in the drawings.

The closest known prior art is U.S. Pat. No. 4,231,051 which discloses techniques for manufacturing a Totally-Self-Aligned Transistor; here, gates, contacts, and active areas are aligned to each other as a result of induced self-alignment during fabrication.

The present invention and this patent are both assigned to the same entity, and the subject inventor is a co-inventor of the patent.

The present invention improves over the patent by a technique which eliminates "sidewalk" effects by creating a flat field, thus, eliminating the "$<111>$" transition region from active to field regions. Also, overlap of gate electrode over field regions is totally eliminated by routing gate electrode metal interconnect by running it over the source or drain, thus inducing radiation hardness.

SUMMARY OF THE INVENTION

The present invention enhances hardness tolerance by eliminating the gate electrode overlap and any otherwise parasitic transistor formed thereby. This is accomplished by:

1. Making the gate totally self-aligned with respect to source and drain regions, and, also the field regions, because the gate electrode is confined to the channel regions, while elimination of the $<100>$ to $<111>$ transistions by fabricating the field oxide from polysilicon disposed on top of the silicon bulk $<100>$ surface.
2. Further, the self-alignment is enhanced by routing the gate electrode metal interconnect over the source or drain so as to prevent overlapping of any conductor over channel side regions.
3. Alternatively, the gate electrode metal interconnects can be accomplished with the use of self-aligned first metal plugs over polysilicon gates, and second level metal to complete the interconnect with heavy insulation between the second level metal and the substrate channel side regions, thus minimizing overlap effects.
4. Self-induced alignment minimizes the effect of most misalignments on device yield and reduces the area dedicated to a device to allow for mask misalignment. This results in tripling device density, and the invention provides for fabricating devices to the novel sub-micron sizes for NMOS structures/circuits. Self-aligned sub-micron contacts and gates are obtained by using $Si_3N_4$ to prevent oxidation of areas where contacts and gates are to be formed, while isolating oxide is grown elsewhere.

DESCRIPTION OF THE PREFERRED EMBODIMENT

Figure 1:
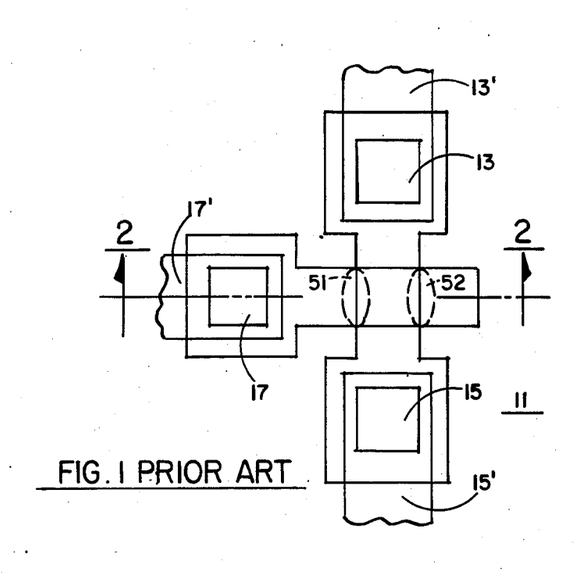
FIG. 1 is a top plan view of a prior art or conventional FET.
Figure 2:
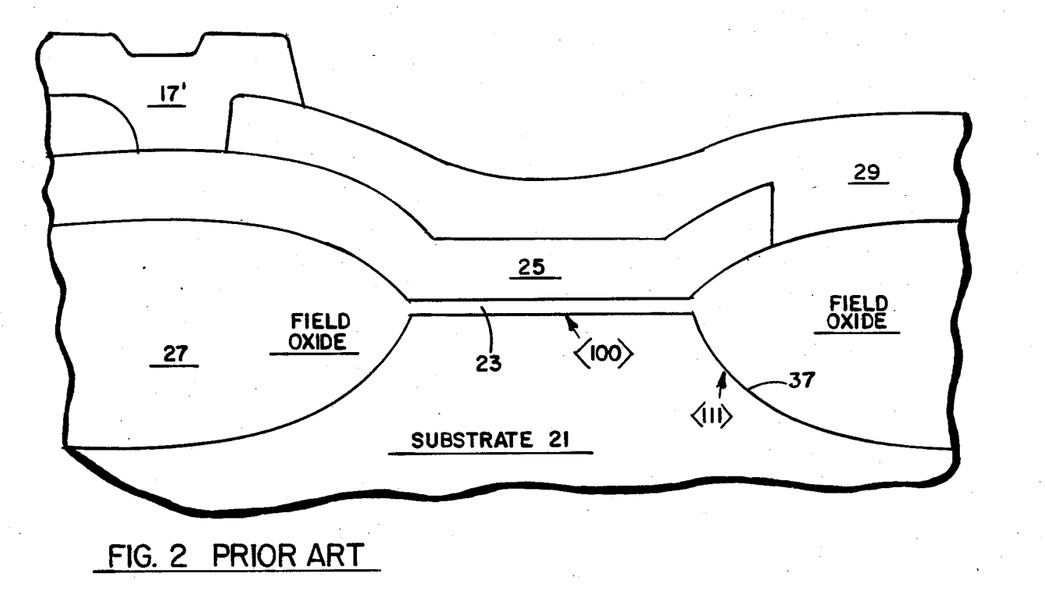
FIG. 2 is a view in section of the FET of FIG. 1, taken along the plane 2—2.

In general, FIGS. 1 and 2 show typical PRIOR ART FETs which exhibit the problem of double overlap and transition regions.

Figure 3:
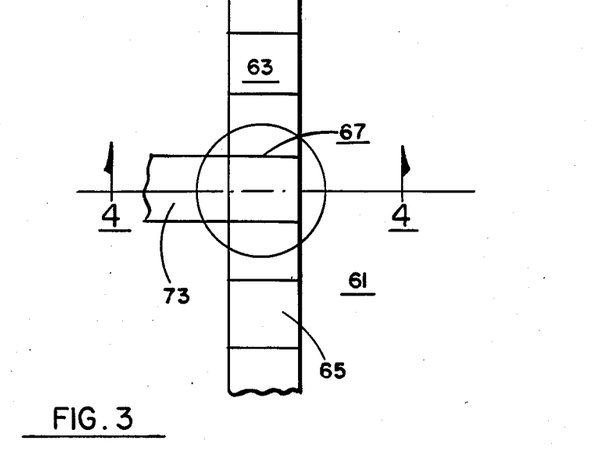
FIG. 3 is a top plan view of a FET fabricated in accordance with an embodiment of the present process.
Figure 4:
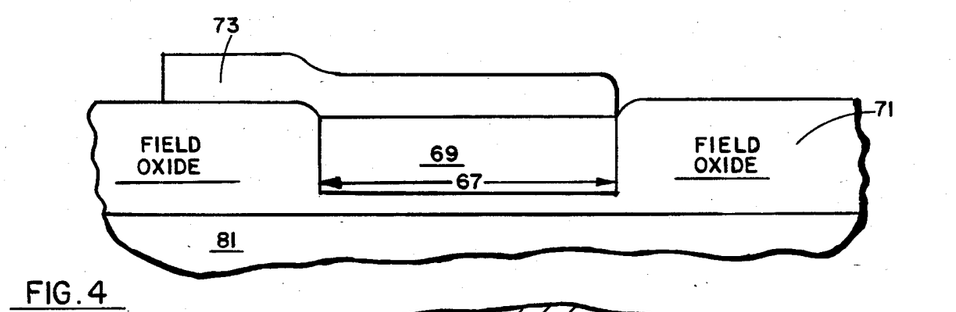
FIG. 4 is a view in cross section of the FET of FIG. 3 taken along the plane 4—4.

FIGS. 3 and 4 illustrate how the first embodiment of the invention eliminates one overlap and the transition regions.

FIGS. 5 through 16 set forth a fabrication process for achieving NMOS devices having only the single overlap and no transition regions, as pictured in FIGS. 3 and 4.

Figure 17:
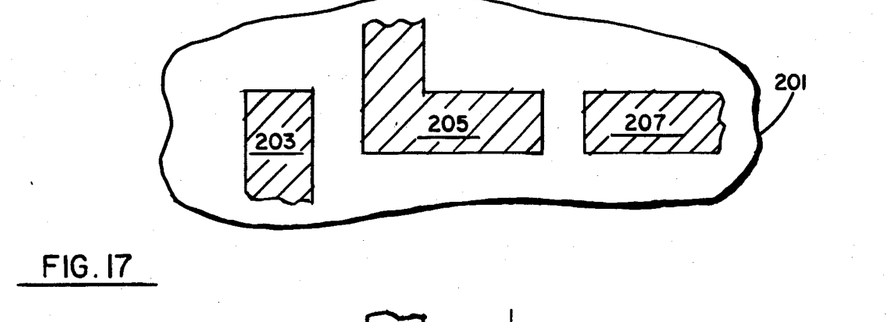
FIG. 17 shows a metal mask for use in making the NMOS devices into harder devices which have no overlap rather than a single overlap.
Figure 18:
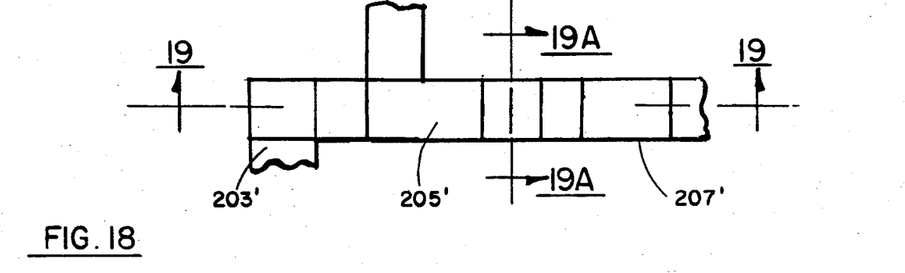
FIG. 18 is a top plan view with the metal in position, indicating the connection to the gate electrode extending over the source or drain so that it does not create any overlap in the channel regions.
Figure 19:
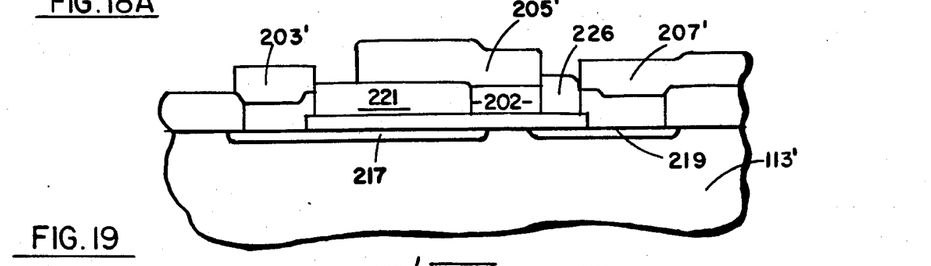
FIG. 19 is a cross-sectional view taken along the plane 19—19 of FIG. 18, and shows the completed device without overlap.

FIGS. 17 through 19 illustrate a preferred modification of this process to provide NMOS devices without any overlap, i.e., totally self-aligned, and also without any field transition.

FIGS. 20 through 24 show a different type modification for providing a double metal NMOS device wherein the single overlap is sufficiently spaced from the field oxide as to overcome the effects of overlap.

In FIGS. 1 and 2, the PRIOR ART transistor or NMOS device 11 is shown in plan view wherein the source contact is visible at 13, drain contact at 15 and gate contact at 17. The interconnecting metal for these contacts is shown, respectively, at 13', 15' and 17'.

In FIG. 2, the substrate region is indicated at 21, the gate oxide at 23, the gate electrode at 25 and the field oxide at 27. A dielectric overcoat PSG or BPSG 29 covers the structure except where the contacts penetrate the overcoat.

The substrate 21 has a planar surface which is <100> beneath the gate oxide 23, and the field oxide 27 extends into the P substrate 21 along the crystal orientation plane <111> to provide the transition regions 37.

Looking at FIG. 1, the problem areas are indicated by the dotted circles 51 and 52 along the channel edges wherein the parasitic devices affect the threshold value of the desired transistor 11. This is caused by the overlap of the gate electrode 25 over the field oxide regions 27, and the transition regions from <100> to <111> occurring underneath the overlap to set up parasitic transistors which develop undesirable paths between the source and drains 13 and 15. An oxide grown on a <111> plane tends to accumulate more charge than oxides grown on <100> planes. Thus, the device is subject to the parasitic influences with respect to threshold voltages and fails to exhibit hardness tolerance to total dose radiation. The parasitic transistors tend to create deleterious leakage paths from source to drain when the transistor is normally in the off state.

FIGS. 3 and 4 show a device in accordance with an embodiment of the present invention wherein one overlap has been eliminated and the transitions have been eliminated, thereby enhancing the hardness of the device and improving its performance relative to parasitic effects. The improved device 61 includes a source region 63, drain region 65 and gate region 67.

In both figures, it may be seen that the gate electrode 69 does not overlap the field oxide 71 on the right hand side of the picture, but where the gate electrode metal conductor or interconnect 73 is taken from the gate region 67, overlap of the left region is still present. However, the gate is self-aligned in that the metal 73 is confined to the gate electrode region 69 with the sole exception of the leadout metal 73, e.g., the metal does not overlap the gate electrode in the channel region.

In FIG. 4, it will be seen that the transition is avoided on all sides by preventing the field oxide 71 from consuming the P doped silicon substrate 81, thereby leaving only the <100> region of the substrate 81 beneath the active region and the field oxide regions 71. This is accomplished by the use of a layer of polysilicon over the wafer substrate 81 with the active region being protected by a silicon nitride layer while the field region of the polysilicon is at least partly consumed to convert the poly to field oxide, without allowing the conversion to extend into the silicon substrate 81.

Figure 5:
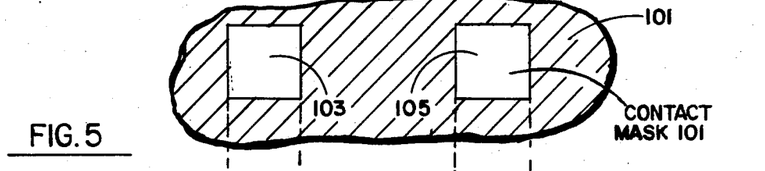
FIG. 5 shows the contact mask for an n-channel device.

Returning to the basic processing steps, in FIG. 5, a contact mask 101 is shown having two contact openings 103 and 105. These openings permit the photoresist layer 107 (FIG. 6), laid down over the thin oxide region 109 on silicon wafer 113, to become soluble due to light impingement through the apertures 103 and 105, such that the upper surface of the silicon wafer 113 is exposed in the source and drain regions 104 and 106, designated by apertures 103 and 105.

Figure 6:
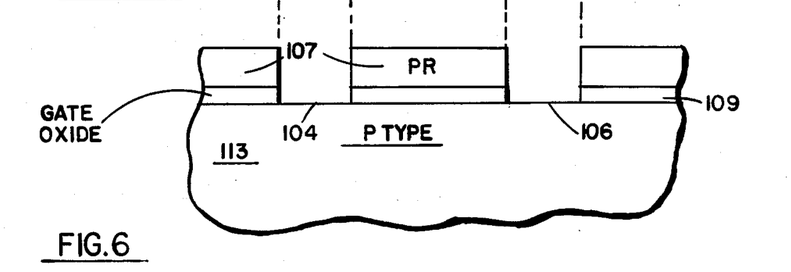
FIG. 6 illustrates the fabrication of an n-channel device relative to the first three steps thereof through employment of the mask of FIG. 5.

The wafer 113 is doped P type and is of the high resistivity type, preferably exceeding 10 ohms-centimeter. The thickness of the gate oxide 109 is of the order of 100 to 1000 angstroms depending upon the particular application and voltage range to be employed.

Figure 7:
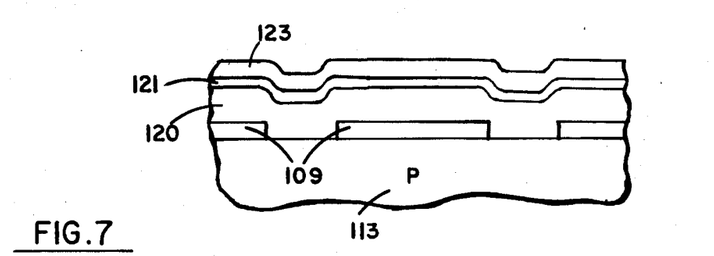
FIG. 7 shows the device of FIG. 6, after succeeding steps including the deposit of a polysilicon layer, silicon nitride layer and low temperature oxide layer.

In FIG. 7, the photoresist has been removed and N doped polysilicon 120 deposited to a depth of 3000 to 5000 angstroms. Next, a layer of silicon nitride 121 is deposited to a thickness of approximately 1000 angstroms. Finally, a layer of LTO (low temperature oxide) 123 or CVD oxide of approximately 3000 to 8000 angstroms thickness is laid down to mask against the subsequent field implant.

Figure 8:
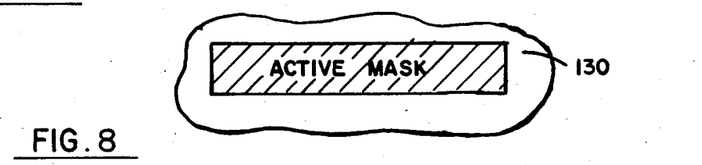
FIG. 8 shows an active mask.
Figure 9:
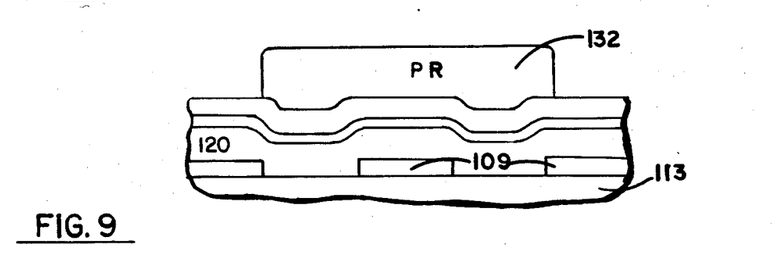
FIG. 9 shows the photoresist left on the LTO layer of FIG. 7 due to use of the mask of FIG. 8.

In FIG. 8, an active mask 130 is provided to protect the active region because the photoresist layer 132 of FIG. 9 therebeneath is insoluble.

In FIG. 9, the LTO, nitride and a portion of the polysilicon are removed by etching, using the photoresist as a mask. The LTO is unnecessary, but renders the photoresist more efficient as a mask against field implant.

During the etching step, the unprotected LTO 123, and silicon nitride 121 are completely removed by dry etching techniques.

It is necessary to calculate the thickness of the polysilicon layer 120 and the time of oxidation in order to be certain that there is converted only polysilicon to the field oxide and none of the bulk wafer 113. An example of such a calculation is 2500 Angstroms of polysilicon is dry etched in a conventional plasma etching equipment, such as a "Dry Tech" device at a rate of 900–1000 Angstroms/min. Thus, 2½ minutes will consume 2500 Angstroms. The remaining polysilicon is oxidized in a steam environment at a temperature of 1000 degrees C. for a period of 60 minutes to a thickness of 6000 Angstroms. Care must be taken to ensure that the pyrogenics water system process used is stopped before the bulk silicon is oxidized. For further details of this conventional processing, see "VLSI FABRICATION PRINCIPLES, by Ghandhi, copyright 1983, page 385.

Figure 10:
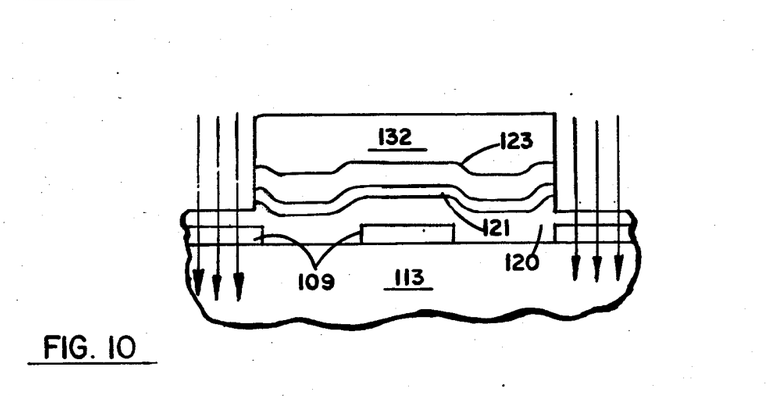
FIG. 10 shows the high energy field implant and removal of layers by etching for conversion of the polysilicon layer to oxide.

In FIG. 10, a high energy field implant, implants boron by a 100 to 200 KeV implanter, to a concentration of between $10^{15}$ and $10^{17}$ atoms per centimeter$^3$, to a depth of 3000 to 5000 Angstroms. These atoms actually penetrate the wafer 113 to comprise a guard around the active region.

Figure 11:
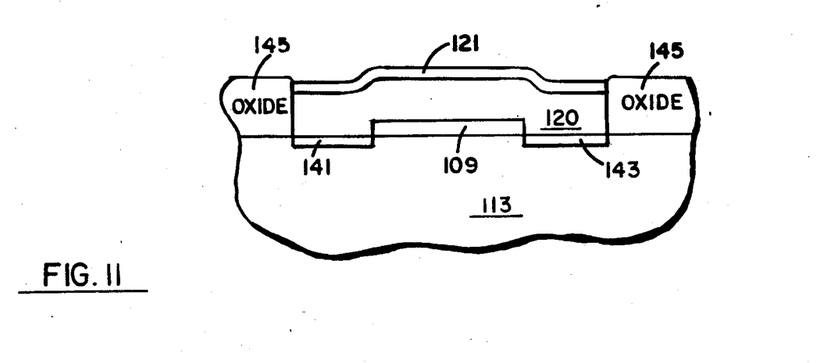
FIG. 11 shows the device after removal of the photoresist and low temperature oxide and the growing of the field oxide using the nitride layer as a mask. Also dopant has been driven in from the doped polysilicon to begin the formation of the source and drain regions.

The above-described conversion is shown in FIG. 11, along with the doping of the source region 141 and drain region 143, due to the heating of the doped polysilicon 120 to a temperature of approximately 1000° C. for 90 minutes in pyrogenic steam environment. The nitride mask 121 remains over the active region and it was this mask which protected the doped poly 120 from being oxidized but permitted the remaining polysilicon 120, on either side of the active area to be oxidized substantially to the heighth of the protected polysilicon 120 for a planar surface, as seen at 145.

Normally, the photoresist 132 and low temperature oxide 123 are removed before growing the field oxide with the nitride 121 over the active regions serving as the mask to prevent oxidation beneath it.

It will be noted from FIG. 11 that there is no <111> plane or transition region beneath any overlap because only the <100> surface 106 is presented by the upper surface of the bulk silicon 113. This improves over the LOCOS process utilized by some in industry today.

Figure 12:
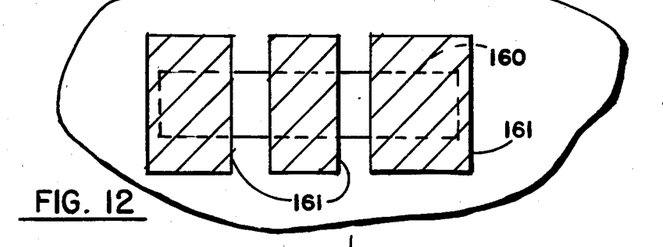
FIG. 12 shows both a gate contact mask and an active mask for the NMOS device of FIG. 13.

Next, FIG. 12 discloses an active mask 160 (which will be used subsequently), and a gate contact mask 161 with all segments of the masks being opaque. Mask 161 is provided for use in opening the regions adjacent the inner ends of the source 141 and drain 143 to permit phosphorus ions to be implanted by an ion implanter capable of 200 Kev to complete the channel region. $1 \times 10^{15}$ to $1 \times 10^{16}$ atoms/cm$^2$ are implanted through a thickness of 2500 Angstroms of polysilicon, as shown by arrows 159. Consequently, gate-contact mask 161 permits the now applied photoresist to be removed over these regions for etching away of the nitride and part of the exposed polysilicon 120, depending on the thickness of cross-over oxide desired. For a planar surface, 2500 Angstroms of polysilicon are etched away. The polysilicon 120 dopant is diffused in a temperature medium of 900 to 1100 degrees C. in a nitrogen ambient to drive in the doped source and drain regions 141 and 143 (FIG. 11), and to form the cross-over oxide 160 and 161. This requires approximately 90 minutes growth in the aforementioned steam environment.

Figure 14:
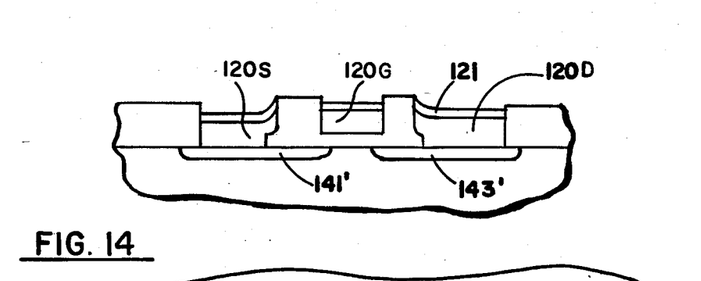
FIG. 14 shows the uncovered polysilicon converted to oxide to form a relatively coplanar FET with polysilicon under the gate electrode.

In FIG. 14, the polysilicon 120 has been oxidized in the regions opened through the nitride layer 121 to form the cross-over oxide 160, 161 to again render a substantially planar surface with the channel under gate electrode 120G having been completed.

Next, the nitride layer 121 is stripped. This layer heretofor has protected the gate and the source and drain contact regions, shown as source electrode 120S, gate electrode 120G and drain electrode 120D.

Figure 15:
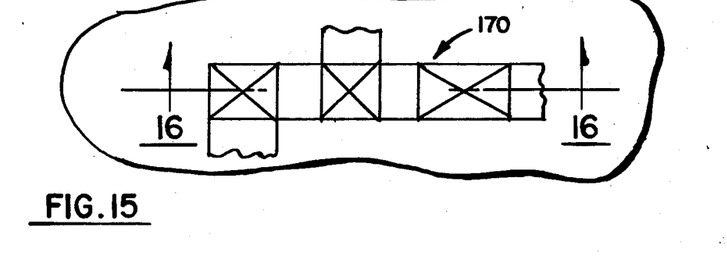
FIG. 15 is a view in plan of the completed single overlap device of FIG. 16, showing the metal interconnects.

Thus, in FIG. 15, the metalization mask 170 is shown for covering the three newly exposed polysilicon regions; region 150 (FIG. 16) for the source polysilicon, region 155 for the polysilicon over the gate, and region 153 for the polysilicon over the drain, all three contact regions being indicated by a large "X" over their surfaces in FIG. 15.

Figure 16:
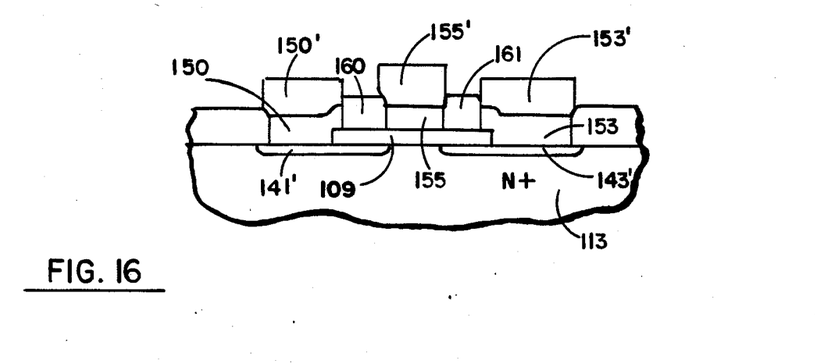
FIG. 16 shows the completed NMOS device in cross section.

The metal interconnects for these contact regions are also shown in FIG. 16, including the broken leads 150', 155' and 153'. The metal etching may be carried out by dry or other conventional techniques.

In FIG. 16, the metal overlapping the polysilicon is clearly shown for each electrode and the extended source 141' and drain 143' appear in the P type silicon wafer 113. Note that there remains the two cross-over oxide regions 160 and 161 contiguous with the gate oxide 109. Thus, FIG. 16 shows the completed NMOS device with single overlap.

FIGS. 17 through 19 show the preferred embodiment wherein the single overlap is eliminated and the device has the advantages of no overlap and no transitional regions. This is implemented by bringing the gate electrode out over a source or drain area thereby avoiding the parasitic effects. In FIG. 17, there is provided a proper metal mask for the structure of FIG. 19 in order to eliminate the single or double overlap.

Metal mask 201 (FIG. 17) replaces mask 170 (FIG. 15) and includes the opaque sections 203 for the source, 205 for the gate, and 207 for the drain.

FIG. 18 shows this mask in place over the active region of the device of FIG. 14 (with the nitride removed) or FIG. 16, without the metal, to preserve the metalization over the source, as seen at 203' (FIG. 18), over the gate, as seen at 205' and over the drain, as seen at 207'.

Figure 19A:
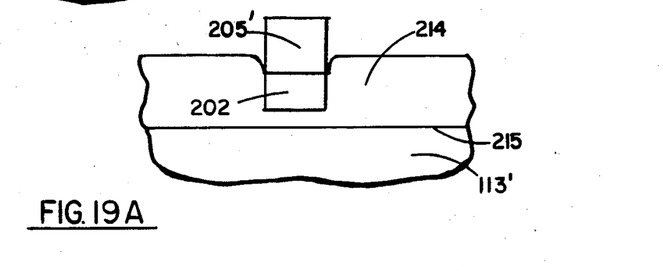
FIG. 19A shows a cross section of the metal connection to the gate electrode, as taken along the plane 19A—19A of FIG. 18 to show gate electrode connection without overlap from channel to field region.
Figure 20:
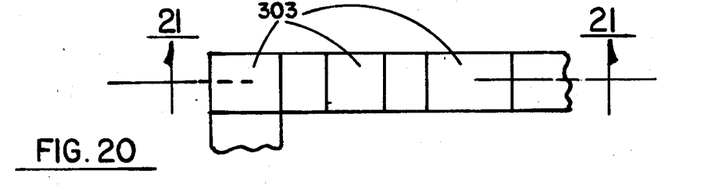
FIG. 20 shows the first metal mask for fabricating the double metal NMOS device.

FIG. 19A illustrates a section of FIG. 18 through the gate electrode 202, showing the metal 205' coextensive with the gate electrode 202 therebeneath, but without any overlap over the adjacent field oxide 214, the interface between the wafer 113' and the device being shown at 215.

However, it should be noted that the device source 217 and drain 219 are formed within the bulk silicon 113', as described in the above process. It may be seen that the cross-over oxide 221 (FIG. 19) is more extensive between the source electrode 216 and the gate electrode 202 in this embodiment to accommodate the offset in the metal interconnect 205'. The gate electrode (polysilicon) 202 is located between the cross-over oxide 221 and the cross-over oxide 226.

Figure 18A:
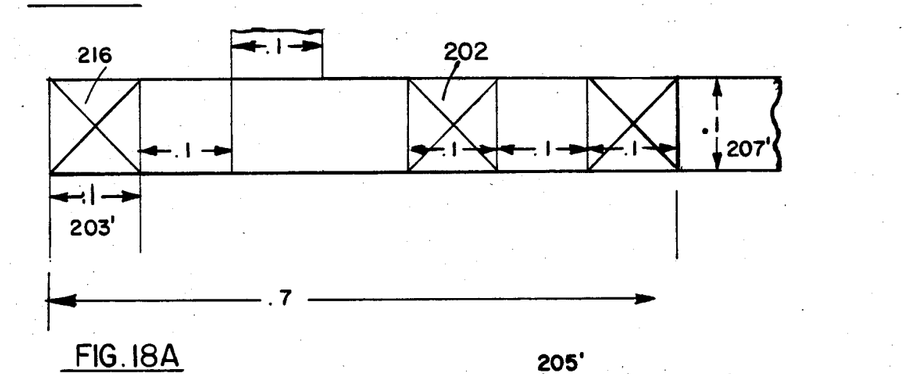
FIG. 18A is a full size submicron NMOS FET with dimensions applied thereto.

An E-beam fabricator available at the present time is manufactured by Varion Associates under the styles VLS-20, VLS-40 and VLS-80. The later device provides a resolution or line width control of 0.1 micron and a beam size of 0.1 micron. Thus, utilizing one of these devices and the totally self-aligned process described herein, contacts as small as 0.1 of a micron by 0.1 of a micron may be made. FIG. 18A shows the submicron FET of FIG. 19 exaggerated in size to show the contacts which measure 0.1 micron by 0.1 micron on an active region measuring 0.1 micron by 0.7 micron. It should be noted that the gate interconnect lead 205' may use less offset and reduce the overall length of the active portion to 0.6 micron.

It may be appreciated that the described process insures that the contacts, as a result of the gate contact mask 161 (FIG. 12), when taken with the active mask 130 (FIG. 8) and metal mask 170 (FIG. 15) cannot exceed the dimensions of the respective electrode surfaces therebeneath, and hence automatically conform to the width of the active region. The spacing between contacts is similarly dictated by the gate-contact mask and the metal mask.

Initially, source and drain contact mask 101 (FIG. 5) opens oversize apertures to the bare silicon. Superposition of the active mask 160 selects only a portion of each such aperture. Then, superposition of gate-contact mask 160 spaces the source, drain and gate for total self-alignment. Metal mask 170 is simply indexed to the position of active mask 160, thereby insuring the FIG. 18A layout.

Figure 24:
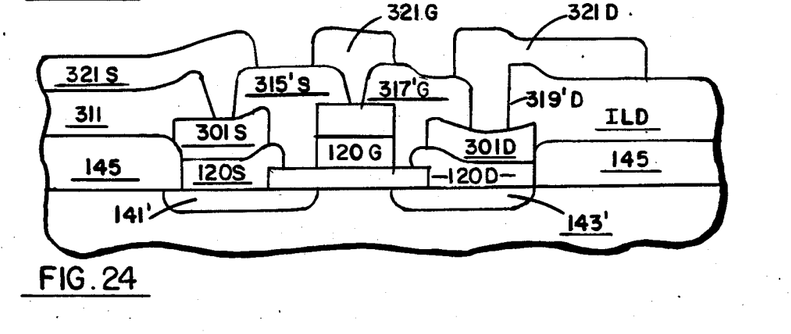

This arrangement may be used for the other embodiments herein, including the two-layer metal device of FIG. 24. Here contacts may be made even smaller due to the via mask 313 of FIG. 22.

Certainly, this process is not limited to such small contacts or devices, but may accommodate a wide range of larger sizes with inherent accuracy.

FIGS. 20 through 24 show an alternative embodiment wherein the use of double metal avoids parasitic effects by locating the gate interconnect remotely above the channel.

The process of FIGS. 20 through 24 is applied to the work product of FIG. 14 after the nitride layer 121 has been stripped, or to FIG. 16 without the metal. A layer of metal 301 (only 301S, 301G and 301D are visible in FIG. 21) is laid down across the wafer 113" and is then covered with photoresist, with mask 303 in FIG. 20 being applied over the metal and the photoresist exposed, then the soluble photoresist removed by etching, and then, the unprotected metal being etched away, followed by stripping of the photoresist to provide the metal plugs 301S, 301G and 301D over the polysilicon 120 over the source (120S), gate (120G), and drain (120D).

Figure 21:
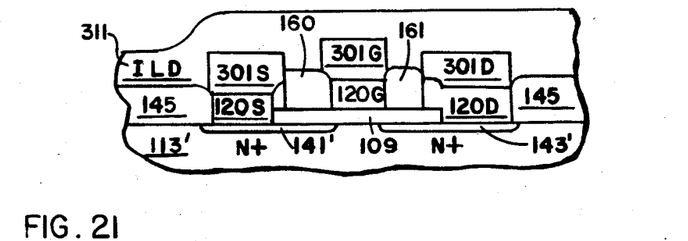
FIG. 21 shows the NMOS structure with ILD (Inter Level Dielectric) covering the whole structure, as seen along the plane 21—21 of FIG. 20.

Next, a layer of ILD (Inter Level Dielectric) 311 is applied over the wafer 113". This dielectric may be CVD oxide or LTO, as used heretofor.

Figure 22:
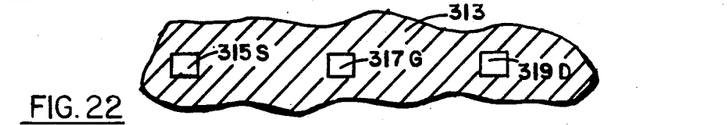
FIG. 22 shows the via mask which provides for openings through the ILD to the first metal for connection to the second metal.

Next, photoresist (not shown) is applied over the ILD 311, and then VIA mask 313, is positioned over the photoresist such that the apertures 315S, 317G and 319D lie directly over the metal 301S over the source, metal 301G over the gate and metal 301D over the drain. The photoresist is next exposed to actinic light and rendered soluble within the apertures 315S, 317G and 319D such that dry etching opens the ILD to the first metal 301S, 301G and 301D over the respective elements of the transistor. The vias or openings are best seen in FIG. 24 as 315'S, 317'G and 319'D.

Figure 23:
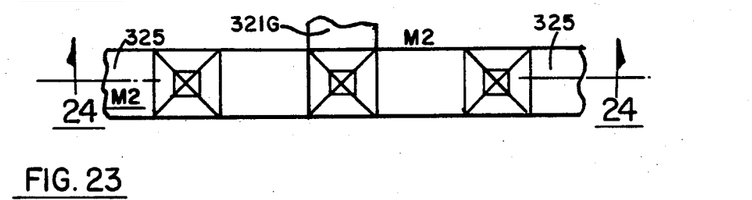
FIG. 23 shows the metal 2 mask over the via mask to complete the structure; and, FIG. 24 shows the double layer metal NMOS device in cross section, as seen along the plane 24—24 of FIG. 23.

Next, the photoresist is stripped and a second layer of metal is deposited over the entire wafer. Then, the metal 2 (second layer) mask 325 of FIG. 23 is positioned over the via openings. The photoresist is rendered soluble where not protected by the mask 325 and the metal is then etched where not protected by photoresist. The photoresist (not shown) is stripped and the wafer is submitted to a sintering process to establish good contacts between the two metals and the polysilicon so as to complete the structure of FIG. 24. The second metal is identified at 321S, 321G and 321D, respectively in contact with the source, gate and drain.

Thus, it will be seen that the metal interconnect 321G for the gate overlaps the transition between the channel and the field oxide but its effects are completely diminished because of the spacing between the metal and the substrate 113". It may be seen that the spacing is now made up of field oxide 145 and ILD 311.

In summary, the device of the present process exhibits reduced gate capacitance with improved speed performance and enhanced immunity to total dose radiation primarily due to elimination of the <100> to <111> transitions and channel overlaps.

It should now be appreciated that the present invention provides the most minimal size MOS devices attainable because they consist primarily of active elements, except for the cross-over oxide which may be made as small as 0.1 micron wide.

In the prior art, the minimum overlap of active region (See FIG. 1) relative to contact (electrode areas 120) had to be at least 0.8 micron. But, in the present invention, since the electrodes 120 (FIG. 13) are doped with the same material as the source and drain junctions (N+) being connected, there is no possibility for the metal interconnect to short circuit from junction to substrate as is the problem with the prior art resulting in the requirement for large area overlap.

The electrodes, being polysilicon, prevent the metal from spiking through shallow junctions, i.e., sub-micron type junctions.

The contacts (electrodes) are of the order of 0.1 micron because:

(a) photoresist and nitride delineate the electrodes, and (b) electrode integrity is maintained by rapid oxidation of the surrounding polysilicon while the polysilicon under the nitride button is preserved.

These factors are common to all embodiments of this invention.

Figure 13:
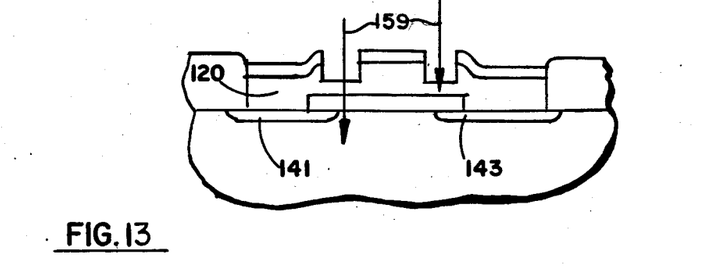
FIG. 13 shows the nitride opened on either side of the self-aligned channel for ion implanting to complete the source and drain regions.

In FIGS. 13 and 14, significant steps are illustrated for making the sub-micron contacts. It is necessary that the polysilicon 120 make contact with the already formed sources and drains because the delineated electrodes 120 are polysilicon which is covered by the nitride buttons. The dimensions of these electrodes is established by the solid regions of mask 160. The masks are used for larger sizes. For smaller sizes, the E-Beam is blanked out for these regions when making contacts down to 0.1 micron by 0.1 micron under computer control. Many current E-Beam micro-fabricators have spot sizes down to 0.1 micron.

Thus, oxidation of the polysilicon unprotected by the nitride buttons fixes these sub-micron contact areas.

These techniques obtain throughout all embodiments presented herein.

What is claimed is:

1. A process for producing NMOS submicron devices on a P-doped silicon wafer, comprising the steps of:
   delineating active regions on the wafer, each region comprising a gate oxide layer having source and drain openings, an N-doped polysilicon layer over the gate oxide layer and openings, and a silicon nitride layer over the N doped polysilicon layer;
   removing the nitride layer and at least a portion of the N-doped polysilicon layer outside of the active region;
   implanting boron ion field implant guard around each active region;
   thermally oxidizing the polysilicon layer to form the field oxide around the active region and dope the wafer via the source and drain regions to outline a source and a drain for each device;
   using a gate-contact mask to open the nitride layer and remove some polysilicon on opposite sides of a channel region formed thereby;
   implanting phosphorus ions into the wafer via the opened nitride layer to extend said source and drain to the opposite sides of the channel;
   growing cross-over oxide where the nitride and polysilicon were removed;
   removing the nitride layer over the polysilicon covering the source, drain and gate and serving as electrodes for the source, drain and gate; and,
   depositing and delineating metal interconnects at least over the source, drain and gate electrodes.

2. The process of claim 1 comprising the further step of:
   using a low temperature oxide layer deposit over the silicon nitride layer to assist in masking the active region against the field implant; and,
   removing the low temperature oxide layer with the nitride layer and n-doped polysilicon layer outside of the active region.

3. The process of claim 2, comprising the further step of:
   depositing low temperature oxide layer over the nitride layer and removing the oxide layer outside of the active region along with the nitride layer and portion of the polysilicon layer.

4. The process of claim 1, wherein:
   the thermal oxidation of the polysilicon is carried on to approximately replace the removed portion of polysilicon.

5. The process of claim 1 wherein the gate interconnect extends toward the source or drain from the gate over the active region before departing the active region thereby avoiding field oxide overlap by the gate interconnect.

6. A process for producing NMOS submicron devices on a P-doped silicon wafer, comprising the steps of:
   delineating active regions on the wafer each comprising a gate oxide layer having source and drain openings, an N-doped polysilicon layer over the gate oxide layer and openings, and a silicon nitride layer over the N-doped polysilicon layer;
   removing the nitride layer and at least a portion of the N-doped polysilicon layer outside of the active region;
   thermally oxidizing the polysilicon layer to form the field oxide around the active region and dope the wafer via the source and drain regions to outline a source and a drain for each device;
   using a gate-contact mask to open the nitride layer and remove some polysilicon on opposite sides of a channel region formed thereby;
   implanting phosphorus ions into the wafer via the opened nitride layer to extend said source and drain to the opposite sides of the channel;
   growing cross-over oxide where the nitride and polysilicon were removed;
   removing the nitrile layer over the polysilicon covering the source, drain and gate and serving as electrodes for the source, drain and gate; and,
   depositing and delineating metal interconnects over the source, drain and gate electrodes with the gate interconnect departing the gate region without touching field oxide in the gate region.

* * * * *